(12) United States Patent
Jinbo et al.

(10) Patent No.: US 6,339,549 B1
(45) Date of Patent: Jan. 15, 2002

(54) SEMICONDUCTOR STORAGE APPARATUS HAVING MAIN BIT LINE AND SUB BIT LINE

(75) Inventors: Toshikatsu Jinbo; Hiroyuki Takahashi; Kazuo Watanabe; Naoaki Sudo; Koji Naganawa; Hironori Nakamura, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/501,624

(22) Filed: Feb. 9, 2000

(30) Foreign Application Priority Data

Feb. 10, 1999 (JP) ............................................ 11-033426

(51) Int. Cl.[7] ............................................. G11C 16/04
(52) U.S. Cl. ............................. 365/185.33; 365/185.11; 365/185.13; 365/230.03
(58) Field of Search ....................... 365/185.33, 185.11, 365/185.13, 230.03, 63

(56) References Cited

U.S. PATENT DOCUMENTS

| 5,126,808 A | | 6/1992 | Montalvo et al. | |
| 5,973,983 A | * | 10/1999 | Hidaka | 365/230.03 |
| 6,016,270 A | * | 1/2000 | Thummalapally et al. | 365/185.11 |
| 6,081,474 A | * | 6/2000 | Togami et al. | 365/185.11 X |
| 6,091,639 A | * | 7/2000 | Iwahashi | 365/185.11 X |
| 6,115,315 A | * | 9/2000 | Yoshida | 365/230.03 |

FOREIGN PATENT DOCUMENTS

| JP | 2-2668 | 1/1990 |
| JP | 3171495 | 7/1991 |
| JP | 4-311900 | 11/1992 |
| JP | 7141869 | 6/1995 |
| JP | 982923 | 3/1997 |
| JP | 9331030 | 12/1997 |
| JP | 10-275484 | 10/1998 |
| JP | 11-506244 | 2/1999 |
| WO | WO 96/41346 | 12/1996 |

* cited by examiner

*Primary Examiner*—Huan Hoang
(74) *Attorney, Agent, or Firm*—Young & Thompson

(57) ABSTRACT

To provide a semiconductor storage apparatus capable of reducing a chip area, one main bit line is provided to a plurality of sub bit lines commonly connected with drains of memory cell transistors, the plurality of the bit lines are connected to ends on one side of switches at a first stage, control terminals of which are respectively inputted with column selecting signals and ends on other side of the switches are commonly connected and connected to the main bit line via a switch at a second stage, a control terminal of which is inputted with a column selecting signal, the sub bit lines are wired to a first wiring layer, the main bit line is wired to a second wiring layer and the second wiring layer is wired with power source lines, lines of voltage control signals in erasing or writing and high voltage power supply lines in regions among the main bit lines.

22 Claims, 16 Drawing Sheets

_US 6,339,549 B1_

SEMICONDUCTOR STORAGE APPARATUS HAVING MAIN BIT LINE AND SUB BIT LINE

BACKGROUND OF THE INVENTION

1. Field of the Invention

The present invention relates to a semiconductor storage apparatus, particularly to a semiconductor storage apparatus of a hierarchical bit line system comprising a main bit line and a sub bit line.

2. Description of the Related Art

In a semiconductor storage apparatus, in order to achieve high density formation and a reduction in capacitance of a word line, conventionally, there has been used an array constitution of a main/sub word line type dividing a word line into a main word line (referred to also as "global word line") and a sub word line.

FIG. 14 is a block diagram showing an example of a constitution of a semiconductor storage apparatus having an array constitution of a main/sub word line type, showing a constitution of EEPROM (electrically erasable and programmable read only memory). In reference to FIG. 14, each of memory cell arrays 1 is provided with an array power supply circuit 4, an X sub decoder 9 and a Y switch 2 and a bit line (not illustrated) above the memory cell array is connected to a data bus via the Y switch and connected to a reading/writing circuit. The array power source circuit 4 is supplied with a control signal from an array power supply control circuit 5 in accordance with writing operation and erasing operation.

According to the semiconductor storage apparatus having the constitution shown by FIG. 14, a size of an X decoder can be reduced by constituting the X decoder by an X main decoder 8 and the X sub decoders 9. However, there is needed a wiring for supplying a main word line from the X main decoder 8 to the respective X sub decoders 9 by passing above the respective memory cell arrays. Further, when a bit line (not illustrated) in the memory cell array 1 constitutes a first wiring layer and the main word line (not illustrated) constitutes a second wiring layer, a hierarchical bit line structure cannot be realized so far as a wiring layer is not added further above the memory cell array and a wiring region is not provided at a peripheral region or the like. Therefore, a data bus region is provided and the bit line of the memory cell array is connected to the data bus 7 via the Y switch 2 to thereby supply read data to the reading/writing circuit 6 and write data from the reading/writing circuit 6. Further, there is constructed a constitution in which a power supply control line from the array power supply control circuit 5 is wired at a periphery of the memory cell array region and is connected to the array power supply circuit 4 of each of the memory cell arrays.

FIG. 15 is a block diagram showing a constitution of EEPROM having an array constitution of a main/sub bit line type and FIG. 16 is a diagram showing a detailed constitution thereof (refer to U.S. Pat. No. 5,126,808).

In reference to FIG. 15, each of the memory cell arrays 1 is provided with the Y switch 2, the array power supply circuit 4 and the X decoder 3 and the main bit line is connected to the reading/writing circuit 6 by passing above the respective memory cell arrays in the vertical direction of the drawing. In each of the memory cell arrays, a sub bit line commonly connected to a drain of a memory cell transistor is connected to the main bit line via the Y switch.

In reference to FIG. 16, according to an array 500, EEPROM cells (00,0) through (mn,k) are arranged by a number of (k+1) of columns 100-0 through 100-k and (m+1) (n+1) of rows 200-00 through 200-mn and at respective rows 200, word lines WL are connected to control gates of the EEPROM cells in the rows.

The array 500 is provided with a plurality of page selecting transistors (0,0) through (m,k). The page selecting transistors (0,0) through (m,k) are arranged at (m+1) rows 300-0 through 300-m and each of the rows is provided with (k+1) of the page selecting transistors. Drain/source of the page selecting transistor (i, j) (notation "i" designates page and notation "j" designates column) is connected to a bit line BLj. For example, the drain/source of the page selecting transistor (0,0) in the column 100-0 is connected to the bit line BL0.

At the column 100-j of the page 400-j, the drain of the EEPROM cell is connected to the page bit line BLj and sources of the cells in the array 500 are commonly connected.

According to the constitution shown by FIG. 15, in comparison with the main/sub word line constitution shown by FIG. 14, although the data bus region can be reduced, there is needed a region of power supply lines and control signal lines leading to an array power supply circuit.

Further, as literatures concerning the hierarchical bit line system of the main/sub bit lines, there are disclosed technologies for making constant a resistance value with regard to discharge current regardless of a position of a memory cell to be read in ROM of the hierarchical bit line system in, for example, Japanese Unexamined Patent Publication No. 4-311900 and so on.

As described above, according to the constitution of the conventional semiconductor storage apparatus, it is necessary to provide wiring regions for the data bus from the memory cell arrays, the power source lines and the control signal lines leading to the array power supply circuit and so on at the periphery of the memory cell array and accordingly, there poses a problem in which the chip size is difficult to reduce.

For example, in respect of memory cell arrays of 512 words 1024 columns, when the main/sub bit lines are constructed by a 1:2 constitution (two sub bit lines per main bit line), a first wiring layer is wired with 1024 of the sub bit lines and a second wiring layer is wired with 512 of the main bit lines. Normally, the second wiring layer is provided with a wiring rate of about a half of that of the first wiring layer and accordingly, in this case, in the second wiring layer, the wiring region becomes full by only wiring the main bit lines and other control signals and the like need to provide at peripheries of the memory cell arrays or the like.

That is, arbitrary signal lines cannot be arranged above the memory cell arrays and a reduction in the chip area is hindered.

SUMMARY OF THE INVENTION

Therefore, the present invention has been carried out in view of the above-described problems and it is an object thereof to provide a semiconductor storage apparatus capable of reducing a chip area.

In order to achieve the above-described object, according to an aspect of the present invention, there is provided a semiconductor storage apparatus, wherein sub bit lines commonly connected with drains of a plurality of memory cell transistors are connected to main bit lines via a plurality of stages of switches.

More in details, according to another aspect of the present invention, there is provided a semiconductor storage apparatus wherein one main bit line is provided to a plurality of sub bit lines commonly connected with drains of a plurality of memory cell transistors, wherein the plurality of sub bit lines are connected to ends on one side of Y switches at a first stage, control terminals of which are respectively inputted with column selecting signals and wherein ends on other side of the Y switches at the first stage are commonly connected and connected to the main bit line via Y switches at a second stage, control terminals of which are inputted with column selecting signals. Further, the above-described object can be achieved also by other aspects of the present invention, described below.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

An explanation will be given as follows of embodiments according to the present invention. According to the present invention, in an array constitution of EEPROM (flash memory) of, for example, a batch erasing type, there is adopted a hierarchical bit line constitution of main/sub bit lines and a unit of arranging a main bit line is set at an interval in which other signal lines or power source lines can be arranged among a plurality of the main bit lines in a wiring layer the same as that of the main bit lines.

Figure 11:
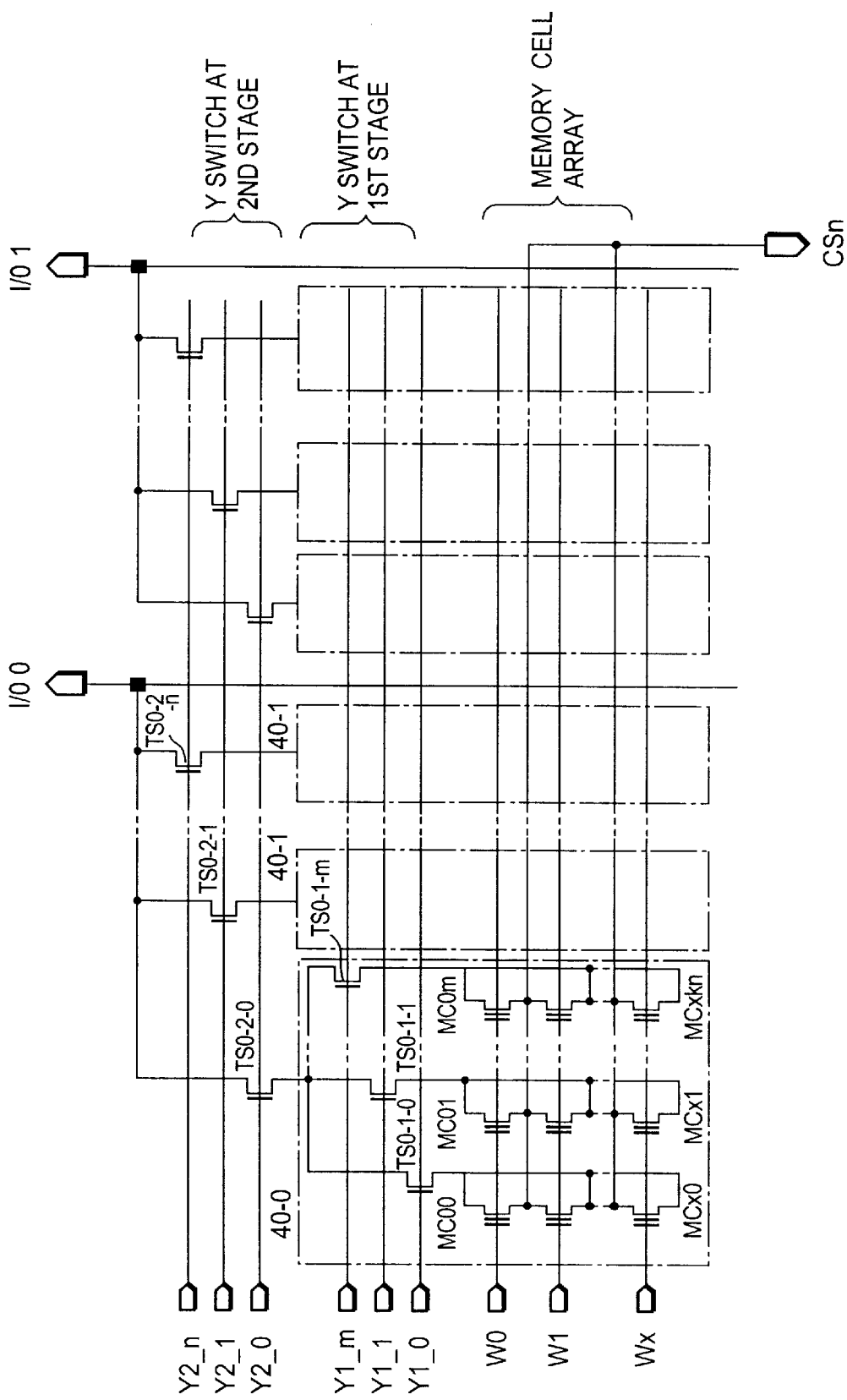
FIG. 11 is a diagram showing a detailed constitution of the third embodiment according to the present invention.

More in details, according to the semiconductor storage apparatus of the present invention, in a preferable embodiment thereof, for example, in reference to FIG. 11, there is constructed a constitution in which one main bit line is provided to several sub bit lines constituted by commonly connecting drains of memory cell transistors, the plurality of sub bit lines are connected to ends on one side of a first stage of switches (TSO_1_0 through TSO_1_m) respectively inputting column selecting signals (Y1_0 through Y1_m) to control terminals thereof and ends on the other side of the switches at the first stage are connected to a main bit line (I/O 0), described above, via switches (TSO_2_0 through TSO_2_n) of a second stage for inputting column selecting signals (Y2_0 through Y2_n) to control terminals thereof.

Figure 12:
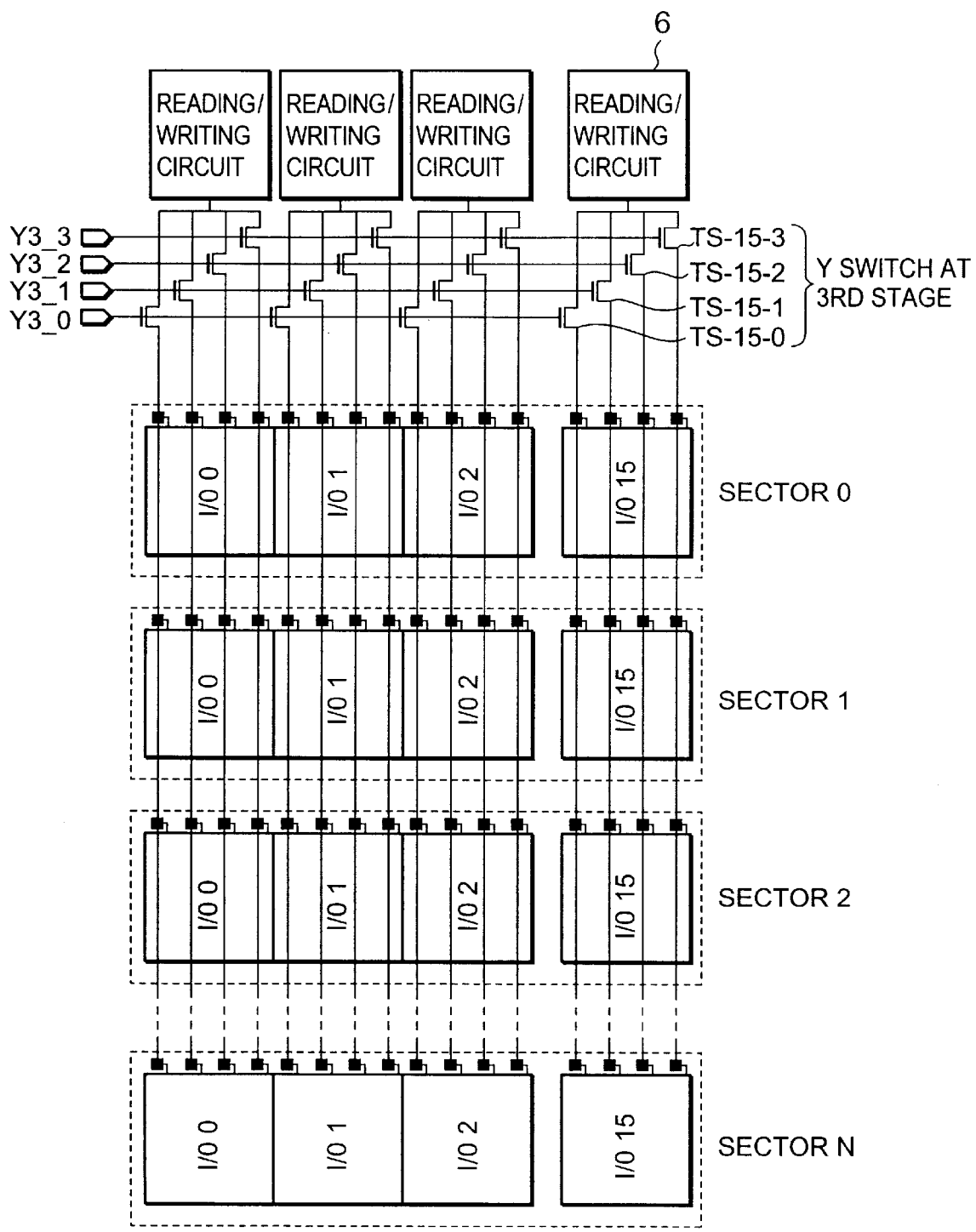
FIG. 12 is a diagram showing a constitution of a fourth embodiment according to the present invention.

Further, according to the embodiment of the present invention, in reference to FIG. 12, there may be constructed a constitution in which the main bit lines are connected to reading/writing circuits via switches of a third stage inputting column selecting signals (Y3_0 through Y3_3) to control terminals thereof.

Further, according to the embodiment of the present invention, sub bit lines are wired in a first wiring layer, the main bit lines are wired to a second wiring layer and in the second wiring layer, at regions among the main bit lines, there are wired power supply lines of power supply lines, ground lines and so on and lines for control signals and voltage control signals in writing operation and erasing operation.

Further, according to the embodiment of the present invention, the Y switches may be provided on both sides of the memory cell arrays. That is, the Y switches in the first stage connected to the sub bit lines, are alternately connected to one end and other end of each of the sub bit lines with regard to the sub bit lines contiguous to each other and the switches at the second stage connected to the Y switches at the first stage are also alternately arranged in correspondence with the switches at the first stage.

According to the embodiment of the present invention, arbitrary signal lines and power source lines can be arranged above the memory cell arrays, the wiring area on the chip can be reduced and the chip size can be reduced. Further, the size is reduced by alternately arranging the Y switches in a zigzag shape on both sizes of the memory cell arrays.

Further, the sub bit lines are connected to the main bit lines via switch transistors to thereby reduce parasitic capacitances of the bit lines in view from the side of the reading/writing circuit and leakage current of the memory cells.

(Embodiments)

Figure 1:
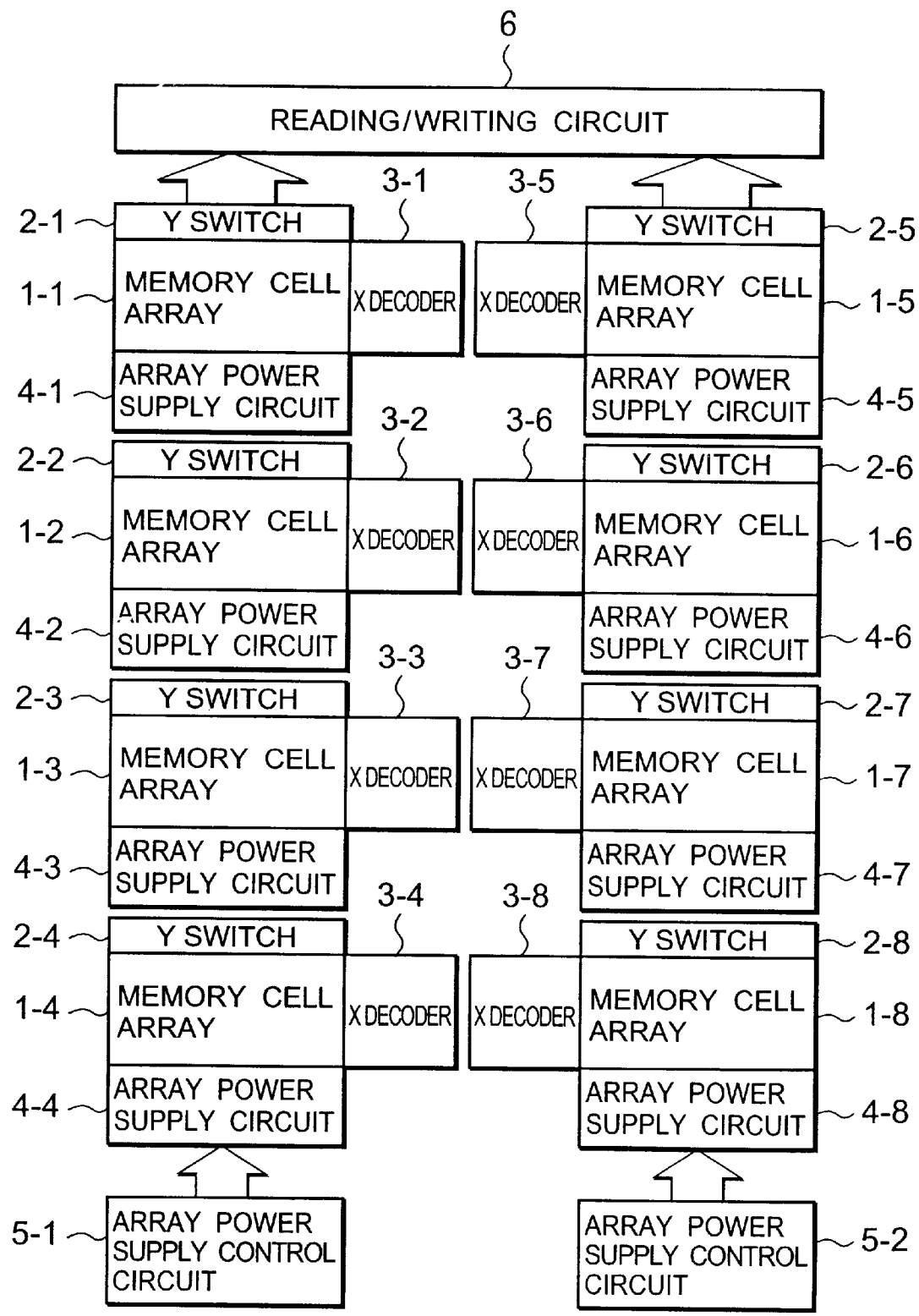
FIG. 1 is a block diagram showing a total constitution of an embodiment according to the present invention.

An explanation will be given as follows of embodiments according to the present Invention in reference to the drawings. FIG. 1 is a block diagram showing a total arrangement constitution of a semiconductor storage apparatus according to an embodiment of the present invention. In reference to FIG. 1, according to the embodiment of the present invention, a unit of the memory cell array 1 is connected with the X decoder 3, the Y switch 2 and the array power supply circuit 4. The X decoder 3 activates or deactivates a predetermined main word line in the memory cell array 1 based on an address signal supplied from outside. Based on an address signal supplied from outside, a Y decoder (not illustrated) outputs a column selecting signal for selecting a main bit line to the Y switch 2. Further, the one unit of the memory cell array 1 constitutes a batch erasing unit of EEPROM and is normally referred to also as "sector" (or "memory cell array sector").

A bit line (sub bit line) formed by a first wiring layer in the memory cell array 1 is decoded by the Y switch 2 and is connected to the main bit line formed by a second wiring layer, the main bit line is arranged in parallel with the sub bit line above the memory cell array 1, wired by passing above a plurality of memory cell arrays 1-1 through 1-4 or 1-5 through 1-8 in the vertical direction of the drawings and is connected to the reading/writing circuit 6. In this case, the reading/writing circuit 6 is a circuit for determining storage information by comparing an amount of current flowing in a memory cell selected by the Y switch 2 with reference current and outputting read data to outside or writing write data supplied from outside to the memory cell selected by the Y switch 2.

Figure 15:
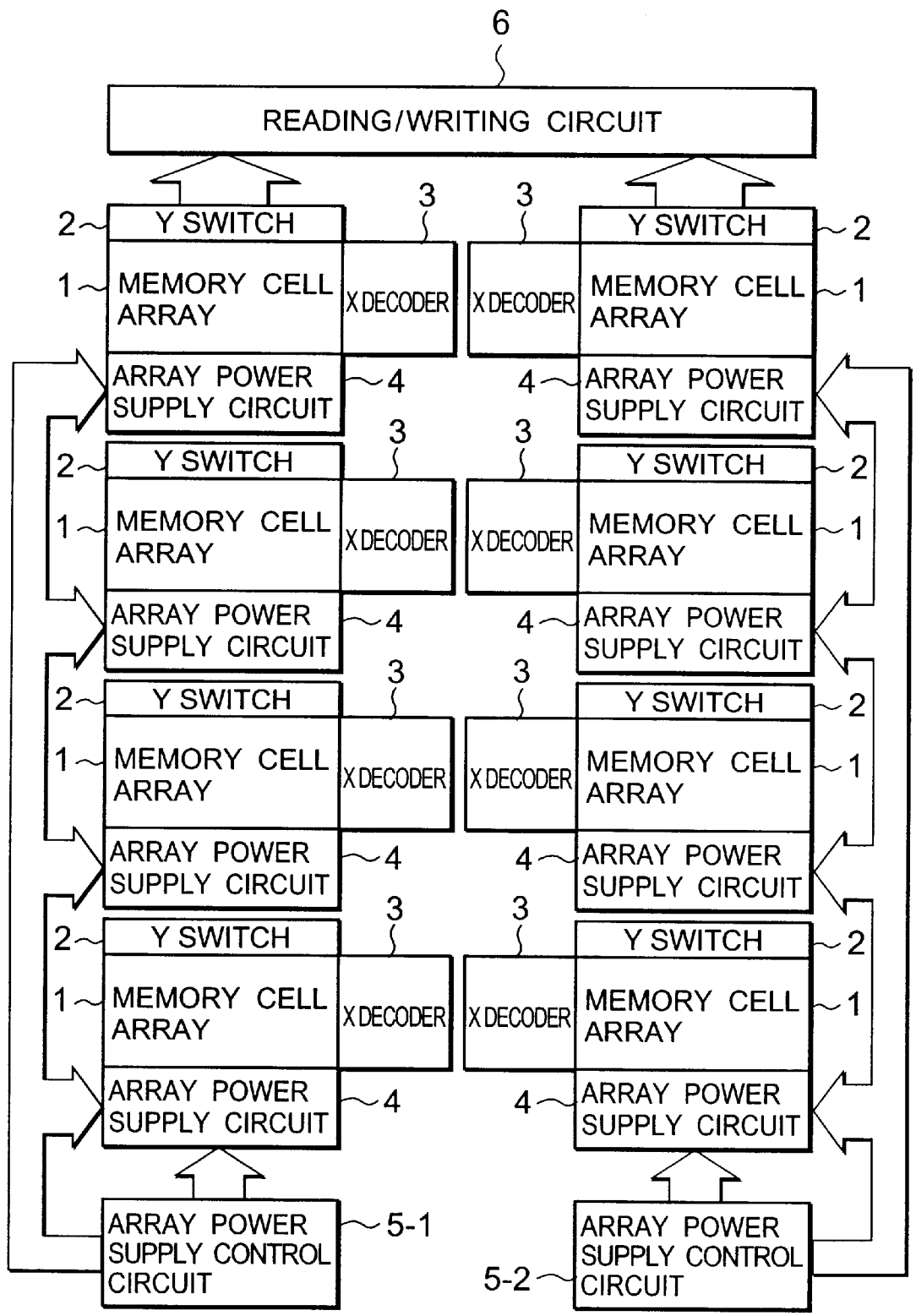
FIG. 15 is a block diagram showing a constitution of a conventional semiconductor storage apparatus of a main/sub bit line type.
Figure 16:
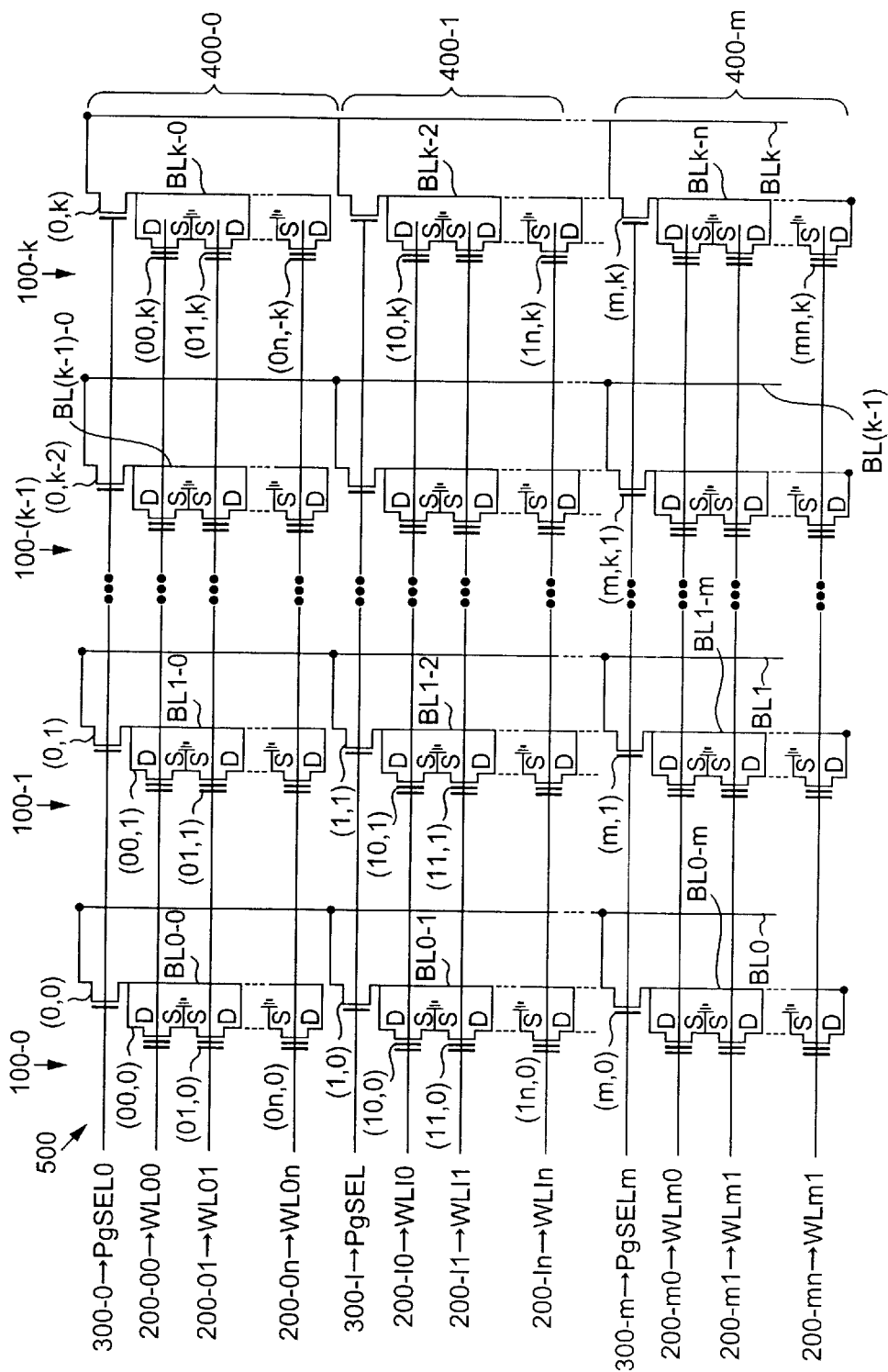
FIG. 16 is a diagram showing a detailed constitution of the conventional semiconductor storage apparatus of the main/sub bit line type.

According to the embodiment of the present invention, power supply lines and control signal lines necessary for the respective array power supply circuits 4 are wired from the array power supply control circuits 5-1 and 5-2 among the main bit lines on the second wiring layer and are connected to the array power supply circuits 4 of the respective memory cell arrays 1. That is, it is not necessary to arrange the control lines of the array power supply circuits at surroundings of the memory cell arrays as in the conventional apparatus shown by FIG. 15 and the chip size is reduced.

The sub bit lines formed by the first wiring layer in the memory cell arrays are decoded by the Y switches vertically laminated at least in two stages, connected to the corresponding main bit lines formed in the second wiring layer and are connected to the reading/writing circuit 6 via the main bit lines.

Figure 2:
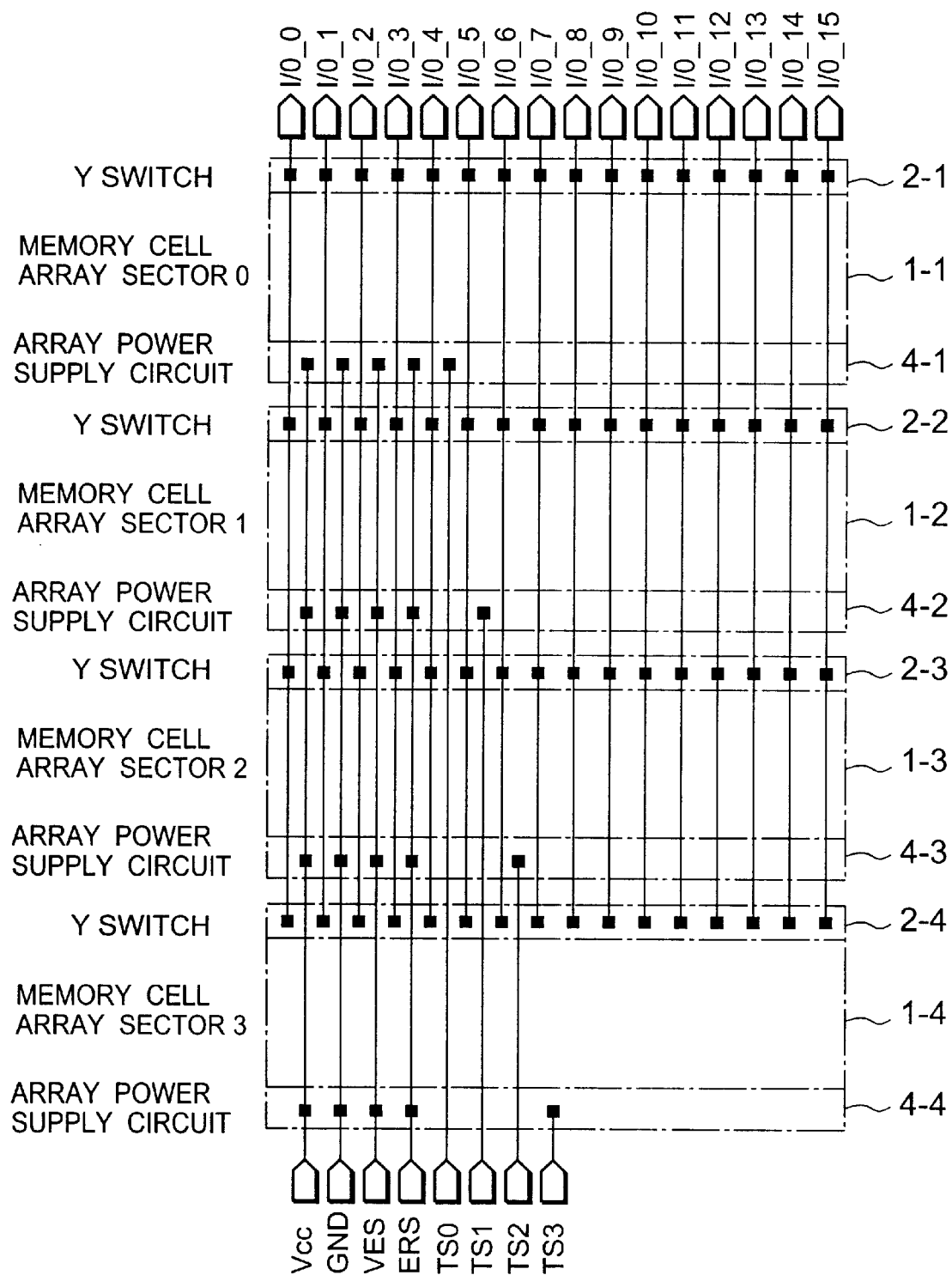
FIG. 2 is a diagram showing a behavior of wiring according to the embodiment of the present invention.

FIG. 2 is a diagram showing a detailed connecting state of the wirings of FIG. 1. In reference to FIG. 2, in the second wiring layer, all of the main bit lines I/O_0 through I_O_15 are wired from the memory array sector 0 above the memory cell array sector 2 and are connected to the respective Y switches of the memory cell array sectors 0, 1, 2 and 3. Further, in the second wiring layer, respective wirings of power supply VCC, ground GND, erasing source voltage VES and erasing source control signal ERS are connected to wire to the array power supply circuits of the respective memory cell array sectors and erasing sector selecting signals TS0 through TS3 are respectively wired to the array power supply circuits of the memory cell array sectors 0 through 3. According to the example shown by FIG. 2, the power supply VCC line is wired between the main bit lines I/O_0 and I/O_1, the ground GND line is wired between the main bit lines I/O_1 and I/O_2, the erasing source voltage VES line is wired between the main bit lines I/O_2 and I/O_3, the erasing source control signal ERS line is wired between the main bit lines I/O_3 and I/O_4 and the erasing sector selecting signal TS0 is wired between the main bit lines I/O_4 and I/O_5 and so on.

Figure 3:
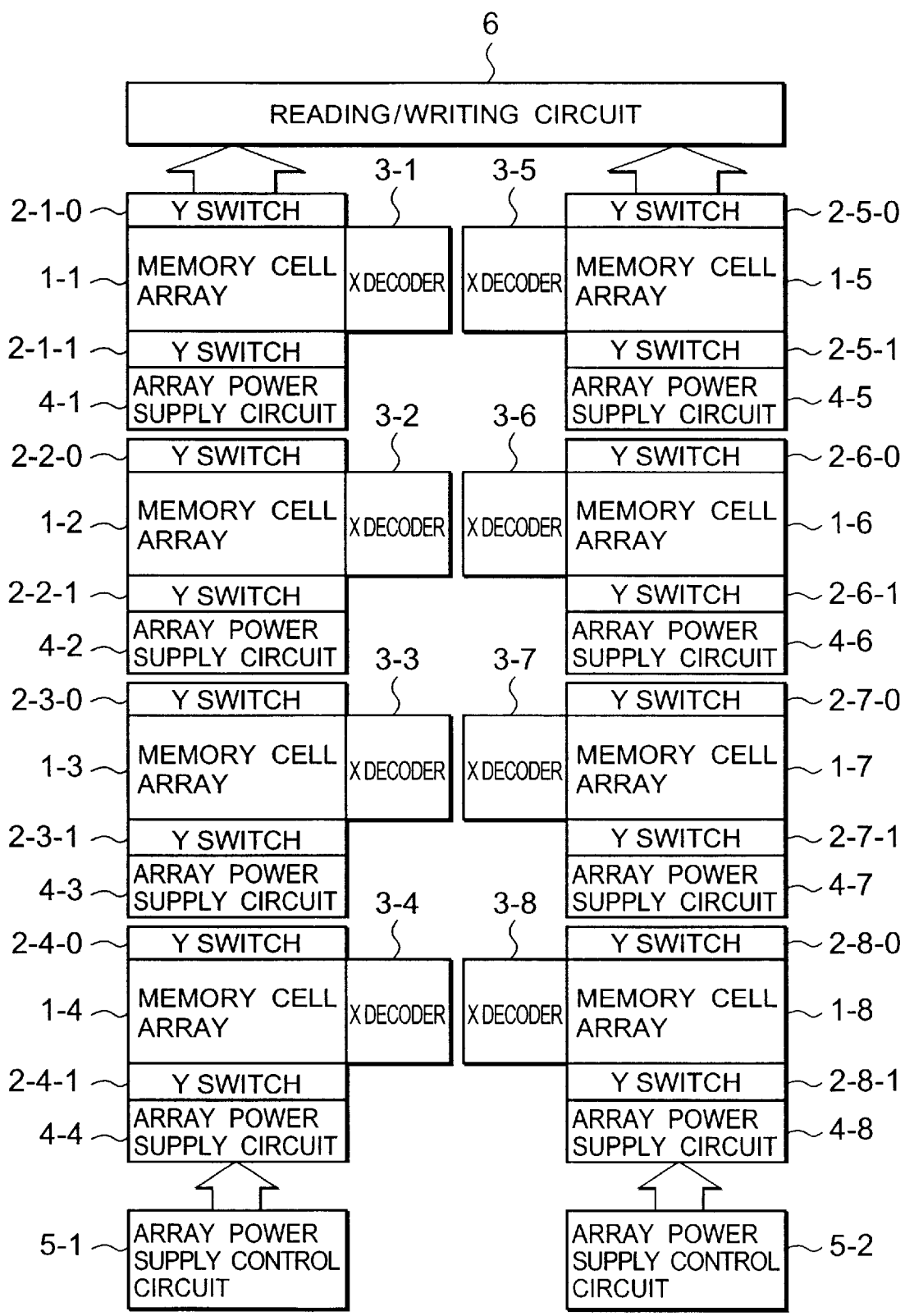
FIG. 3 is a block diagram showing a total constitution of other embodiment according to the present invention.

FIG. 3 is a block diagram showing a total arrangement constitution of a semiconductor storage apparatus according to other embodiment of the present invention. In reference to FIG. 3, the embodiment differs from the above-described embodiment in that the Y switches 2 are provided on both sides of the memory cell arrays. Other constitution stays the same as that of the above-described embodiment. That is, according to this embodiment, the Y switches are provided on upper sides and lower sides of the memory cell arrays alternately in respect of contiguous bit lines of the memory cell arrays and by such a constitution, transistors or contact holes constituting the Y switches can be arranged to disperse to thereby reduce the chip area.

Figure 4:
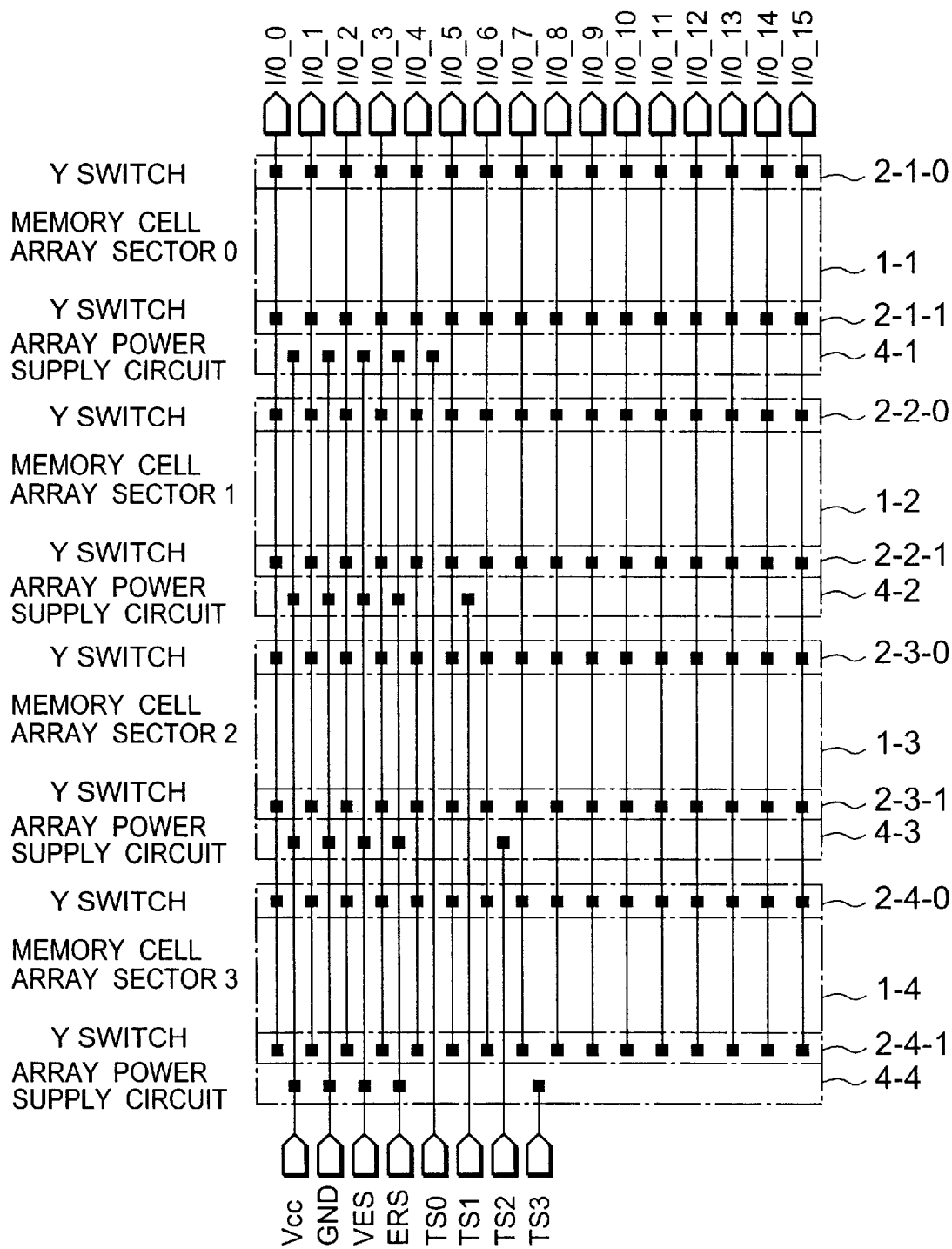
FIG. 4 is a diagram showing a behavior of wiring according to a first embodiment of the present invention.

FIG. 4 is a diagram showing a detailed constitution of FIG. 3. In reference to FIG. 4, in the second wiring layer, all of the main bit lines I/O_0 through I/O_15 are connected from the memory cell array sector 0 to the Y switches on the both sides of the memory cell array sector 3.

Figure 5:
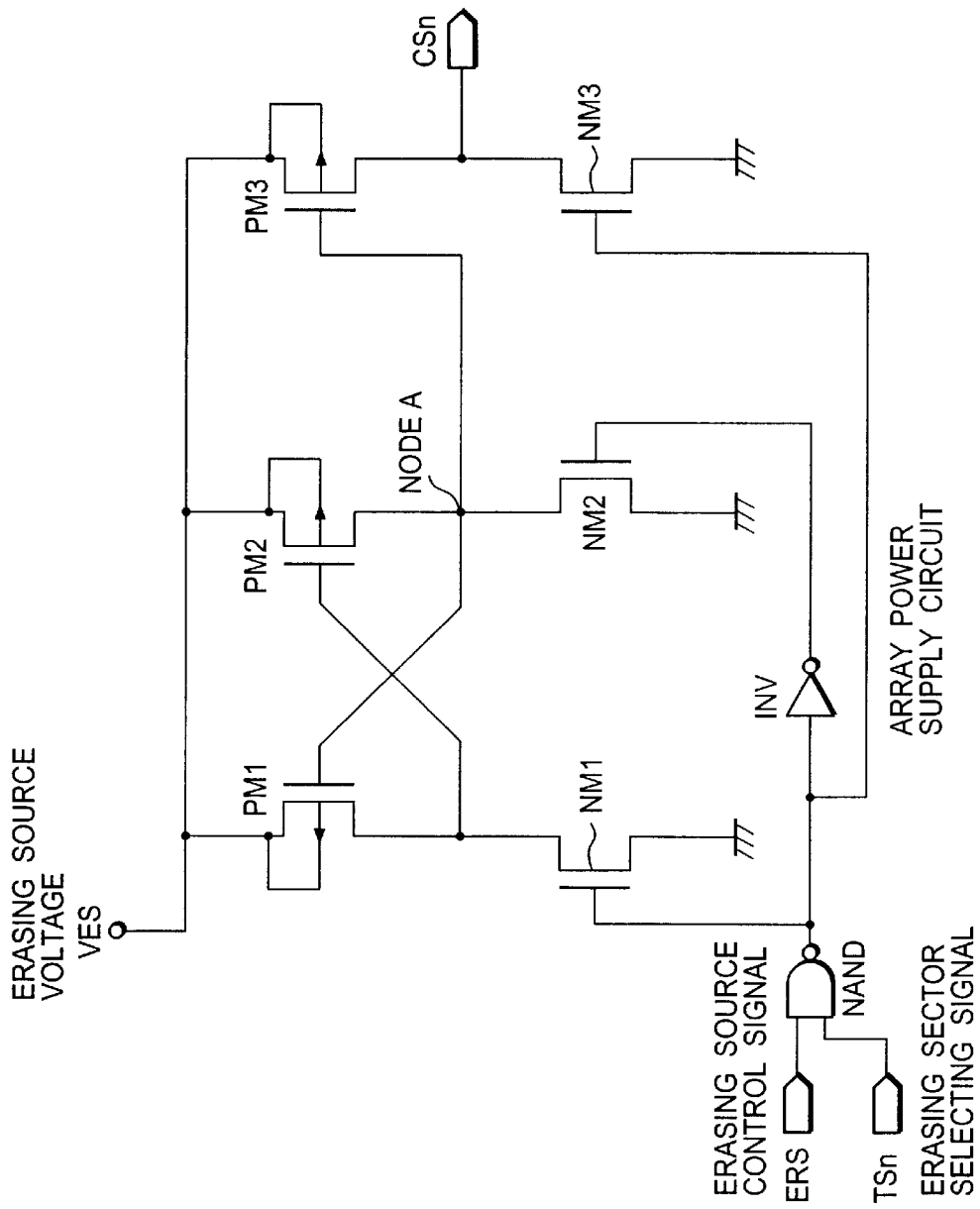
FIG. 5 is a diagram showing a constitution of an array power supply circuit according to an embodiment of the present invention.

FIG. 5 is a diagram showing an example of the array power supply circuit according to the embodiment of the present invention. In reference to FIG. 5, the array power supply circuit is constituted by a NAND gate inputting the erasing source control signal ERS and the erasing sector selecting signal Tsn, an N-channel MOS transistor NM1 the source of which is grounded and the gate of which is inputted with an output from the NAND gate, an N-channel MOS transistor NM2 the gate of which is inputted with a signal produced by inverting the output from the NAND gate by an inverter INV and the source of which is grounded, a P-channel MOS transistor PM1 the source of which is connected to the erasing source voltage VES, the drain of which is connected to the drain of the N-channel MOS transistor NM1 and the gate of which is connected to the drain of the N-channel MOS transistor NM2, a P-channel MOS transistor PM2 the source of which is connected to the erasing source voltage VES, the drain of which is connected to the drain of the N-channel MOS transistor NM2 and the gate of which is connected to the drain of the N-channel MOS transistor NM1, a P-channel MOS transistor PM3 the source of which is connected to the erasing source voltage VES, the gate of which is connected to the drain of the N-channel MOS transistor NM2 and the drain of which is connected to an output terminal CSn, and an N-channel transistor NM3 the source of which is grounded, the gate of which is connected to the NAND gate and the drain of which is connected to the output terminal CSn. The P-channel MOS transistors PM1 and PM2 and the N-channel MOS transistors NM1 and NM2 constitute a latching circuit and the P-channel MOS transistor PM3 and the N-channel MOS transistor NM3 connected in series between the common source voltage VES and the ground constitute an inverted buffer.

When the erasing source control signal ERS is at High level and the erasing sector selecting signal Tsn is at High level, the output from the NAND gate becomes at Low level, the N-channel MOS transistor NM1 is made OFF, the N-channel MOS transistor NM2 is made ON, the P-channel MOS transistor PM1 is made ON, the P-channel MOS transistor PM2 is made OFF, a node A becomes at Low potential, the P-channel MOS transistor PM3 is made ON, the N-channel MOS transistor NM3 is made OFF and accordingly, the erasing source voltage VES is outputted to the terminal CSn. The terminal CSn is connected to the common source of the EEPROM memory cell.

An explanation will be given as follows of various embodiments in accordance with arrangements of the Y switches in the memory cell arrays and the Y switches in two stages or three stages constitution.

Figure 6:
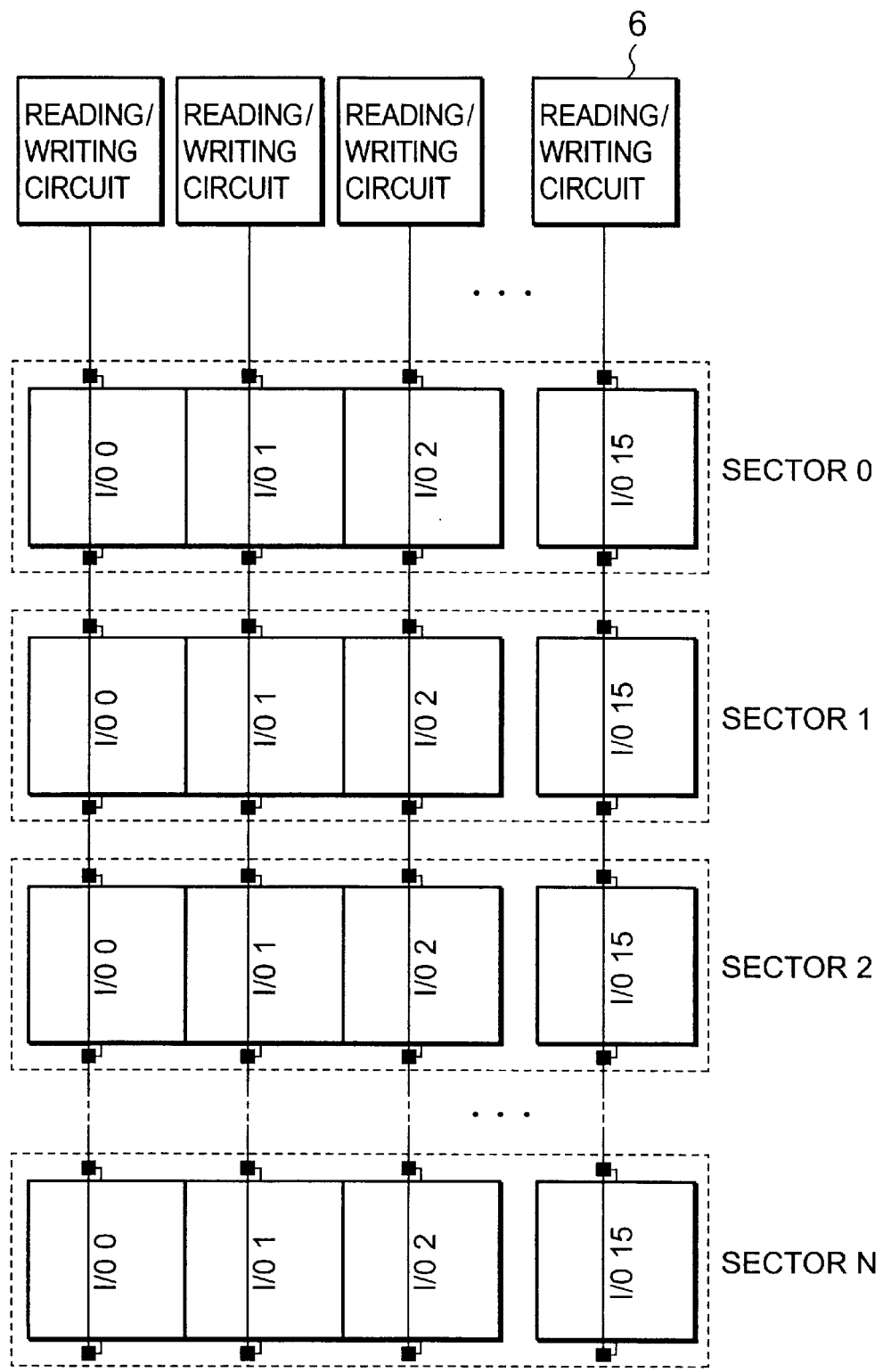
FIG. 6 is a diagram showing the constitution of the first embodiment according to the present invention.
Figure 7:
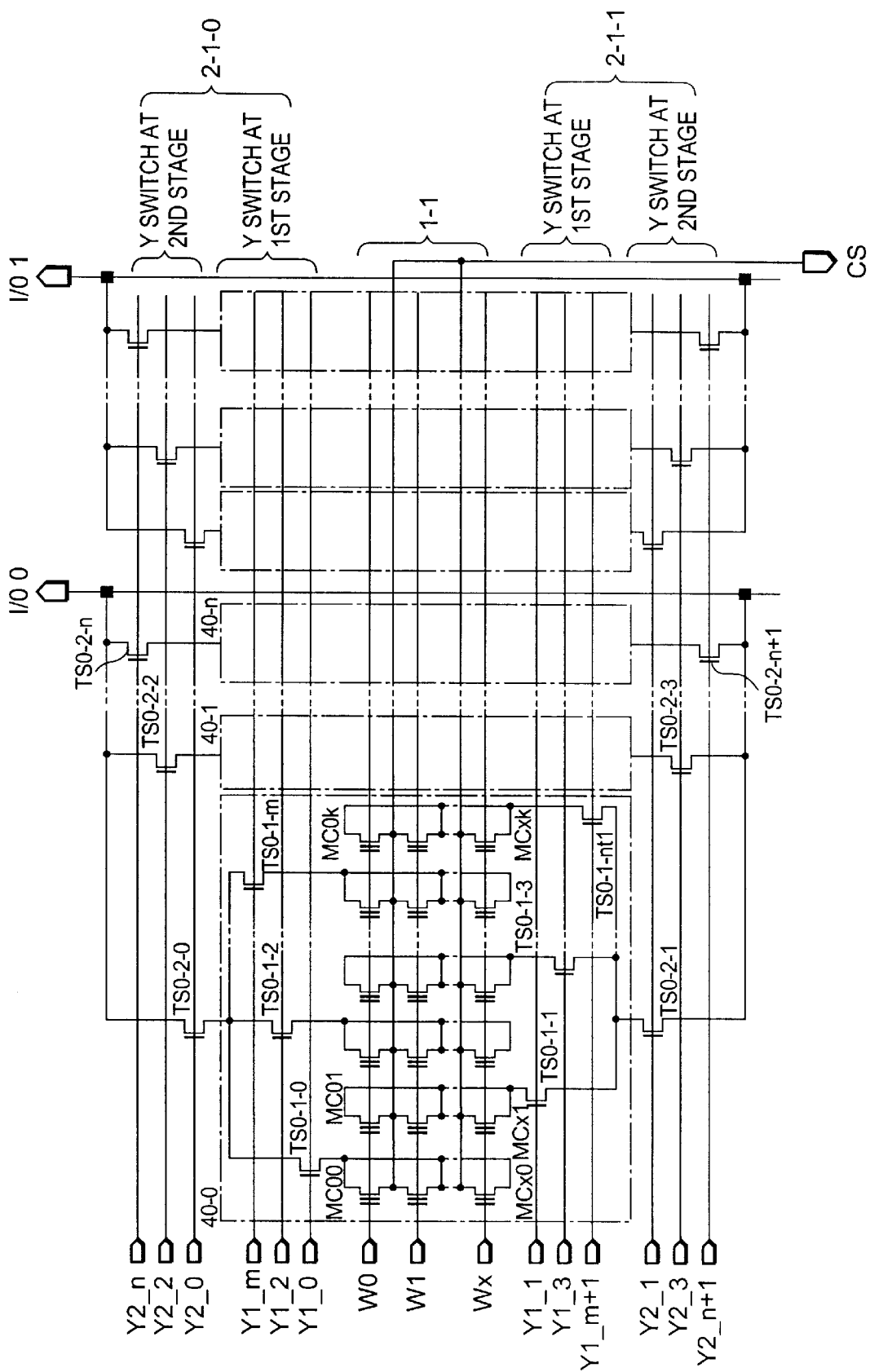
FIG. 7 is a diagram showing a detailed constitution of the first embodiment according to the present invention.

FIG. 6 is a diagram showing a constitution of a first embodiment according to the present invention. In reference to FIG. 6, the embodiment is provided with the Y switches on both sides (upper and lower sides in the drawing) of the memory cell array sectors and is constituted such that a plurality of sub bit lines correspond to one main bit line. As shown by FIG. 6, a semiconductor storage apparatus according to the embodiment is provided with N of memory cell array sectors Sector0 through SectorN and 16 of main bit lines I/O__0 through I/O__15 and the respective main bit lines I/O__0 through I/O__15 are respectively connected to the reading/writing circuits 6. Further, according to the constitution shown by FIG. 6, there are provided the X decoders, the Y switches and the array power supply circuits and there are wired respective wirings of Vcc, GND, VES, ERS, TSO, TS1, TS2 and TS3 as shown by FIG. 1 and FIG. 2, however, illustration thereof is omitted. FIG. 7 is a diagram showing the constitution of the memory cell array sectors according to the first embodiment of the present invention.

In reference to FIG. 7, there is constructed a constitution in which common drains of memory cell transistors $MC_{00}$ through $MC_{X0}$ gates of which are respectively connected to word lines W0 through WX, are connected to a source (or drain) of a column switch (transfer gate) TSO__1__0 the gate of which is inputted with a column selecting signal Y1__0 via the sub bit line, and connected to a bit line I/O 0 via a column switch (transfer gate) TSO__2__0 the gate of which is inputted with a column selecting signal Y2__2, and common drains of memory cell transistors $MC_{01}$ through $MC_{X1}$ disposed at a contiguous column, are connected to a source (or drain) of a column switch (transfer gate ) TSO__1__1 via the sub bit line and is connected to the bit line I/O 0 via a column switch (transfer gate) TSO__2__1 the gate of which is inputted with a column selecting signal Y2__1. In this way, the column switch TSO__2__0 is connected between a common connection point of column switches TSO__1__0 through TSO__1__m connected to the sub bit lines at odd number orders of a block 40__0 and the main bit line I/O 0 and in the meantime, the column switch TSO__2__0 is connected between a common connection point of the column switches TSO__1__1 through TSO__1__(m+1) connected to the sub bit lines at even number orders of the block 40__0 and the main bit line I/O 0. Further, the common source line of the memory cell transistors is connected to the terminal CSn of the array power source circuit (refer to FIG. 5).

In this case, the column switches TSO__1__0 through TSO__1__(m+1) constitute the Y switches at the first stage and the column switches TSO__2__0 through TSO__2__(n+1) constitute the Y switches at the second stage. For example, when a number of the Y switches at the first stage is 8 (m=7) and a number of the Y switches at the second stage is 8 (n=7), a number of the sub bit lines in the one sector connected to the one main bit line is 64.

When the Y switches are constituted by one stage and connection is carried out to the sub bit lines via the Y switches of 64 per main bit line as in the conventional case, in view from the reading/writing circuit, the drains of the Y switches of 64 per sector are regarded as parasitic capacitances. Further, when the Y switches are constituted by one stage and connection is carried out to the sub bit lines via the Y switches of 2 per main bit line as in the conventional case, there are needed 32 of the main bit lines and other wirings cannot be arranged among contiguous ones of the main bit lines.

In contrast thereto, by constituting the Y switches in two stages as in the embodiment, the parasitic capacitances in view from the reading/writing circuit can be reduced to those of 8 transistors, therefore, in reading or writing operation, even when predetermined bias is precharged to the main bit line, the main bit line is rapidly activated and accordingly, the reading or writing operation can be carried out at high speed. Further, electric charge required for precharging operation is reduced and accordingly, power consumption of the semiconductor storage apparatus can be reduced. Further, wirings of the main bit lines can be reduced by $\frac{1}{32}$ and accordingly, the allowance is produced among contiguous ones of the main bit lines and other wirings of power source lines, control signal lines and the like can be arranged contiguous to the main bit lines in a wiring layer the same as that of the main bit lines. As a result, the chip area of the semiconductor storage apparatus can be reduced.

Figure 8:
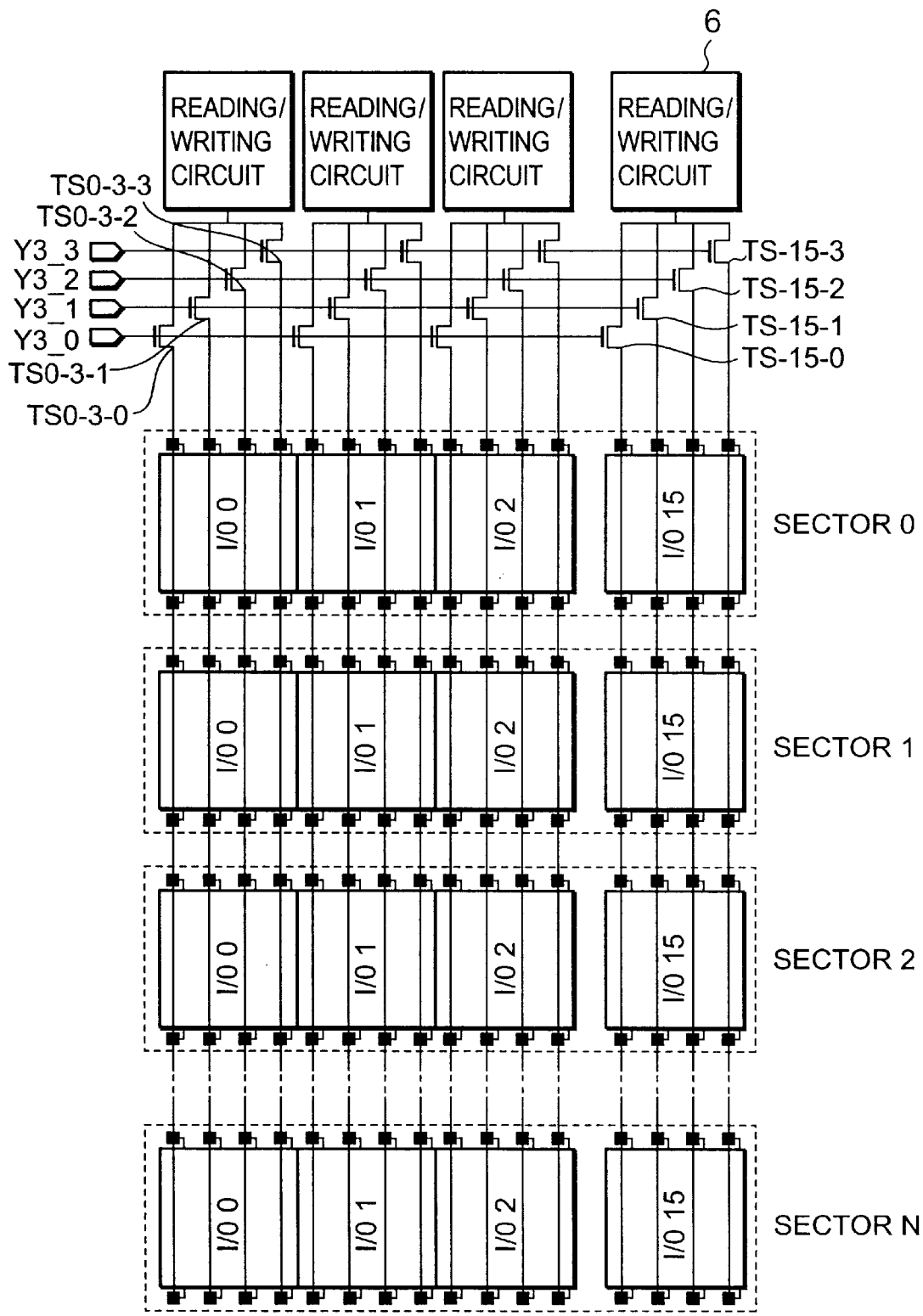
FIG. 8 is a diagram showing a constitution of a second embodiment according to the present invention.

FIG. 8 is a diagram showing a constitution of a second embodiment according to the present invention. In reference to FIG. 8, there is constructed a constitution in which 4 of the main bit lines are connected to the reading/writing circuits via column switches (Y switches at third stage) the gates of which are inputted with column selecting signals Y3__0 through Y3__3. According to the embodiment, one I/O is decoded in 4 divisions, 4 of the main bit lines are arranged on the memory cell arrays by a unit of I/O and according to the memory cell array sectors, the sub bit lines are connected to the main bit lines via two stages of the Y switches. Similar to the first embodiment, FIG. 8 shows only the main bit lines, there are provided the X decoders, the Y switches and the array power supply circuits and illustration of respective wirings of Vcc, GND, VES, ERS, TS0, TS1, TS2 and TS3 is omitted.

Figure 9:
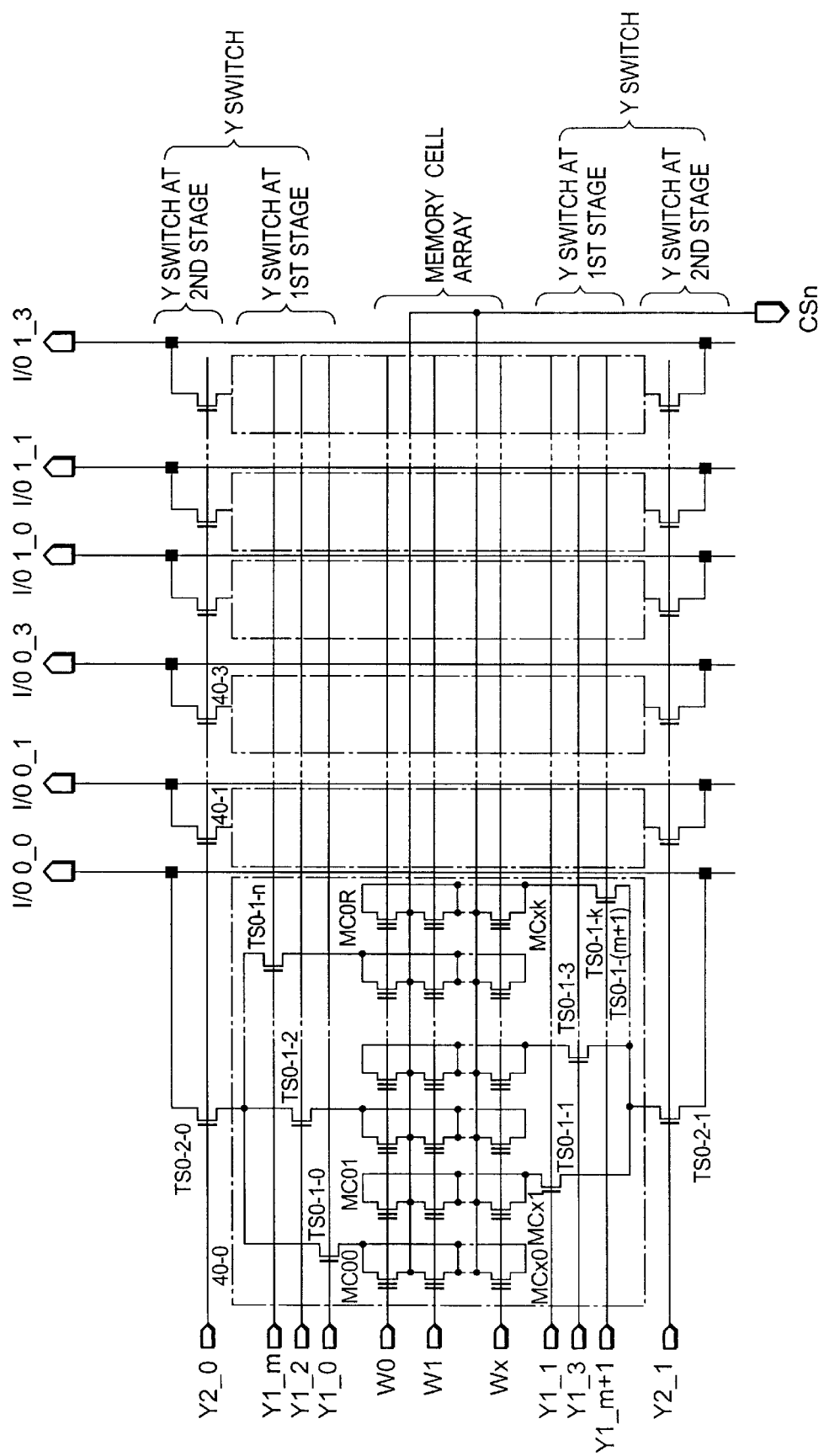
FIG. 9 is a diagram showing a detailed constitution of the second embodiment according to the present invention.

FIG. 9 is a diagram showing a constitution of memory array sectors according to the second embodiment of the present invention shown by FIG. 8. In reference to FIG. 9, there is constructed a constitution in which common drains of memory cell transistors $MC_{00}$ through $MC_{X0}$, are connected to the source or the drain of a column switch (transfer gate) TSO__1__0 the gate of which is inputted with a column selecting signal Y1__0 via the sub bit lines and connected to a bit line I/O 0__0 via a column switch (transfer gate) TSO__2__0 the gate of which is inputted with a column selecting signal Y2__0 and common drains of memory cell transistors $MC_{01}$, through $MC_{X1}$ disposed at a contiguous column, are connected to the source or the drain of a column switch (transfer gate) TSO__1__1 the gate of which is inputted with a column selecting signal Y1__1 via the sub bit lines and are connected to the bit line I/O 0__0 via a column switch (transfer gate) TSO__2__1 the gate of which is inputted with a column selecting signal Y2__1.

According to the second embodiment of the present invention, the common drains of the memory transistors are connected to the bit line I/O 0__0 via column switches at a first stage selected by column selecting signals Y1__0 through Y1__(m+1) and column switches at a second stage selected by column selecting signals Y2__0 through Y2__1 and connected to the reading/writing circuits via the column switch TSO__3__0 (refer to FIG. 8) at a third stage selected by the column selecting signal Y3__0. For example, when a number of the Y switches at the first stage is 8 (m=7), a number of the Y switches at the second stage is 2 and a number of the Y switches at the third stage is 4, a number of the sub bit lines in one sector connected to one main bit line is 64. Further, parasitic capacitances in view from the reading/writing circuit can be reduced to those of 4 transistors. According to this embodiment, in comparison with the above-described first embodiment, the parasitic capacitances in view from the reading/writing circuits can further be reduced and the number of the main bit lines can be reduced to one eighth of that in the conventional example having the constitution of 32 of the main bit lines. As a result, similar to the above-described first embodiment, there can be realized a small-sized chip having high speed.

Figure 10:
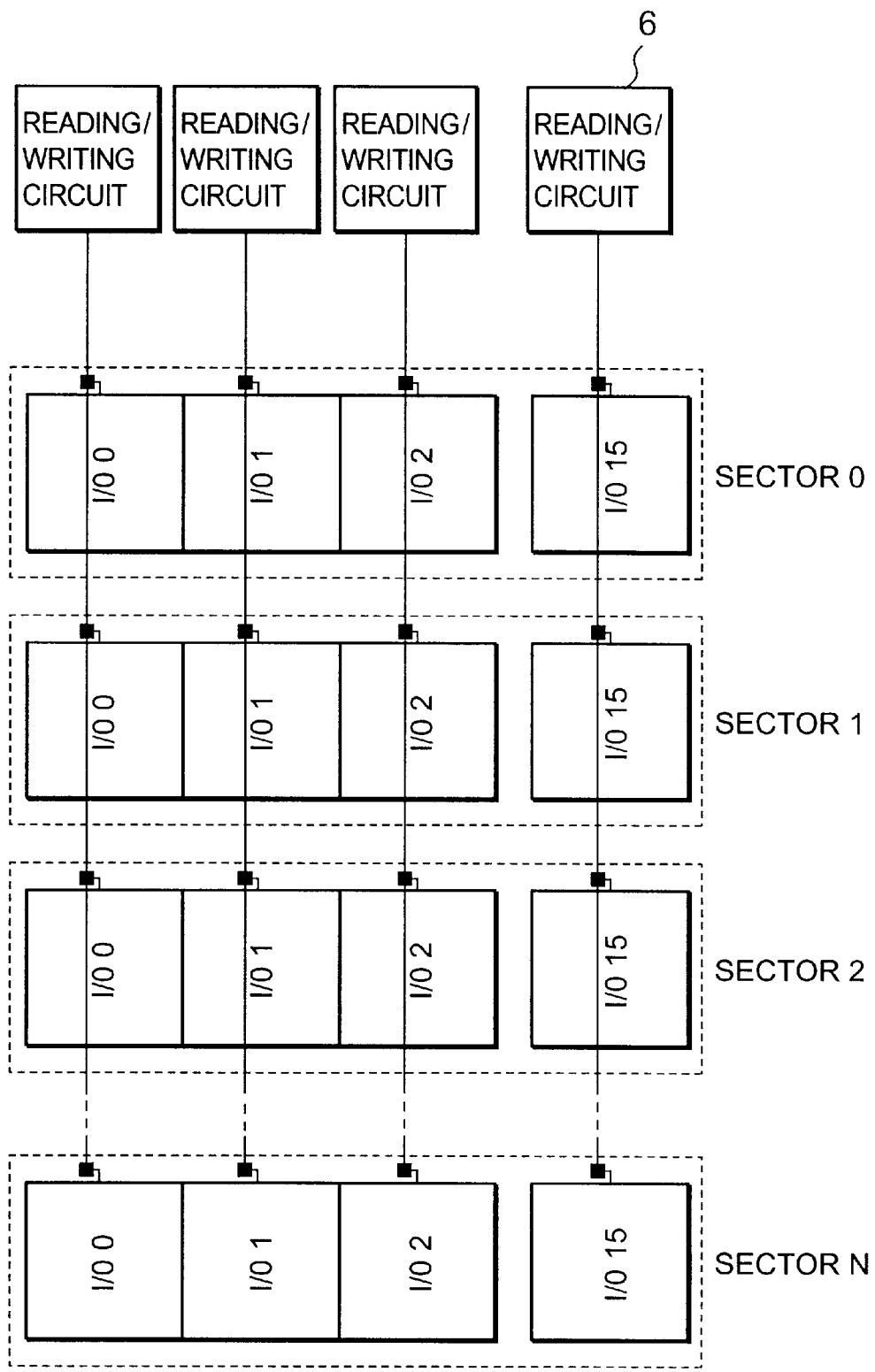
FIG. 10 is a diagram showing a constitution of a third embodiment according to the present invention.

FIG. 10 is a block diagram showing a constitution of a third embodiment according to the present invention. In reference to FIG. 10, the Y switch is provided on one side of the memory array sector and decoding operation is carried out by the Y switch portion up to the I/O unit and one main bit line is arranged above the memory cell arrays by the I/O unit.

FIG. 11 is a diagram showing a constitution of memory cell array sectors according to the third embodiment of the present invention shown by FIG. 10. In reference to FIG. 11, common drains of memory cell transistors $MC_{00}$ through $MC_{X0}$ are connected to the source or the drain of a column switch (transfer gate) TSO_1_0 the gate of which is inputted with a column selecting signal Y1_0 via the sub bit lines and common drains of memory cell transistors $MC_{01}$ through $MC_{X1}$ disposed at a contiguous column, are connected to the source or the drain of a column switch (transfer gate) TSO_1_1 the gate of which is inputted with a column selecting signal Y1_1 and the drains or the sources of column switches (transfer gates) TSO_1_1 through TSO_1_m are commonly connected and connected to a main bit line I/O 0 via a column switch (transfer gate) TSO_2_0 the gate of which is inputted with a column selecting signal Y2_0.

FIG. 12 is a diagram showing a constitution of a fourth embodiment according to the present invention. In reference to FIG. 12, there is constructed a constitution in which 4 of the main bit lines are connected to the reading/writing circuits via column switches TS_15_0 through TS 15_3 at a third stage the gates of which are inputted with column selecting signals Y3_0 through Y3_3. One I/O is decoded in four division, 4 of the main bit lines I/O0 through I/O15 are arranged above the cell arrays by the I/O unit and there are provided column switches each for selecting one of 4 of the main bit lines.

Figure 13:
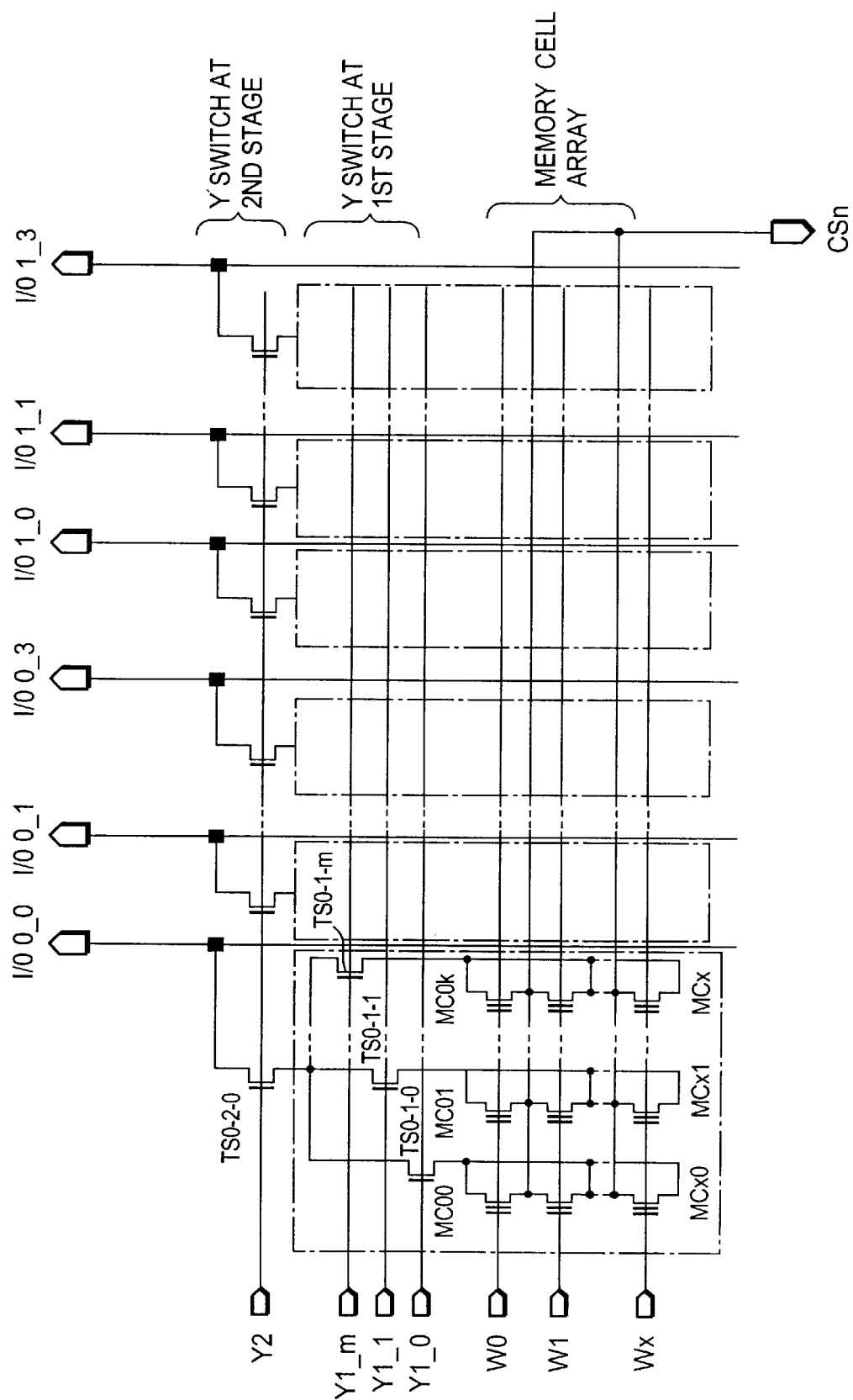
FIG. 13 is a diagram showing a detailed constitution of the fourth embodiment according to the present invention.
Figure 14:
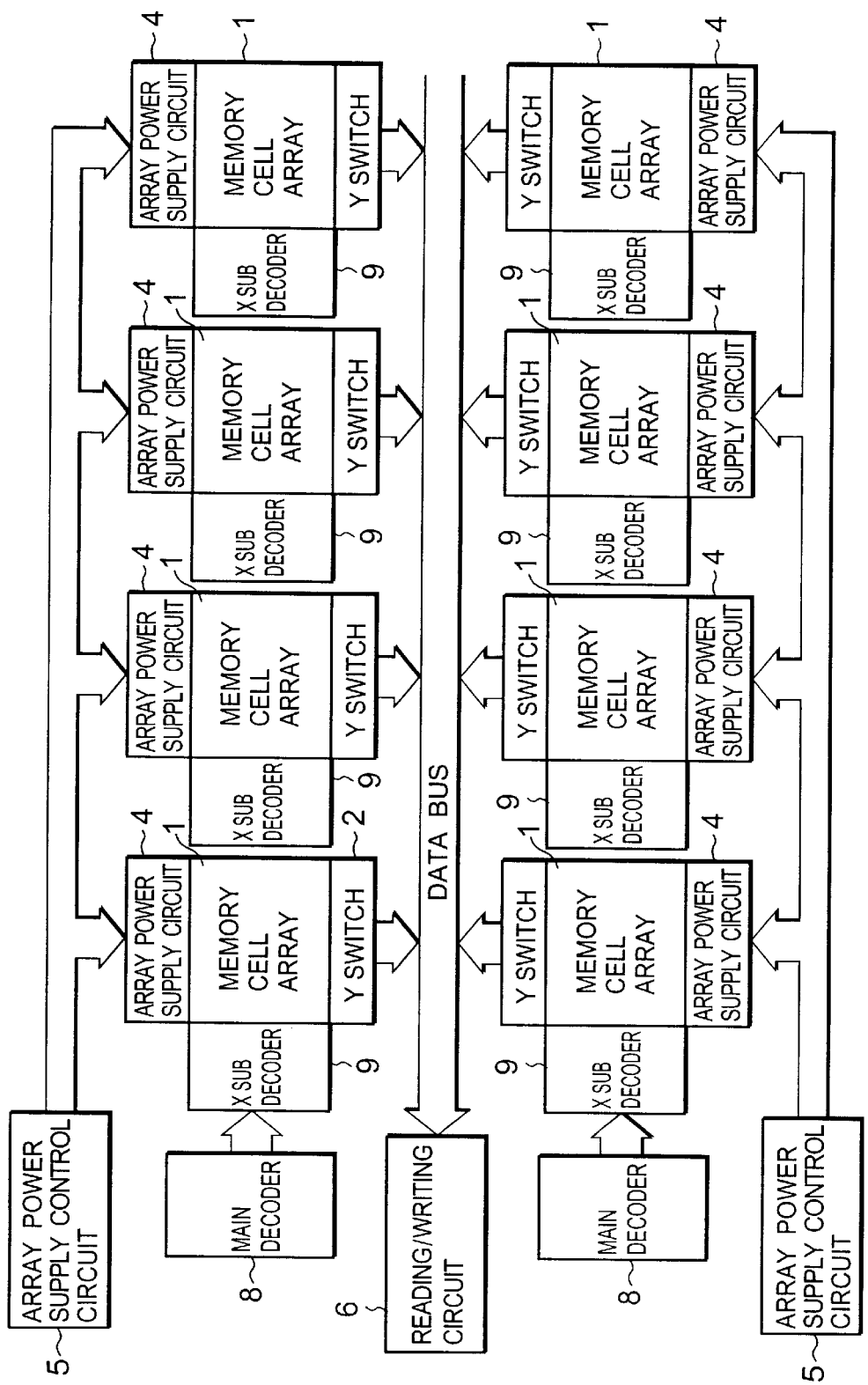
FIG. 14 is a block diagram showing a constitution of a conventional semiconductor storage apparatus of a main/sub word line type.

FIG. 13 is a diagram showing a constitution of memory cell array sectors according to the fourth embodiment of the present invention shown by FIG. 12. In reference to FIG. 13, drains of memory cell transistors $MC_{00}$ through $MC_{X0}$ are commonly connected and are connected to the source or the drain of a column switch (transfer gate) TSO_1_0 the gate of which is inputted with a column selecting signal Y1_0 via the sub bit lines and common drains of memory cell transistors $MC_{01}$ through $MC_{X1}$ disposed at a contiguous column, are connected to the source or the drain of a column switch (transfer gate) TSO_1_1 the gate of which is inputted with a column selecting signal Y1_1 via the sub bit lines and the drains or the sources of column switches (transfer gates) TSO_1_1 through TSO_1_m are commonly connected and are connected to a main bit line I/O 0_0 via a column switch (transfer gate) TSO_2_0 the gate of which is inputted with a column selecting signal Y2. The main bit line I/O 0_0 is arranged above the memory cell arrays and is connected to the reading/writing circuit via a column switch (refer to FIG. 12) selected by the column selecting signal Y3_0.

According to the above-described embodiment, a number of the bit lines arranged above the memory cell arrays can arbitrarily be set such that one to 8 of the sub bit lines, one to 16 of the sub bit lines or the like. By widening intervals among the main bit lines, arbitrary signal lines or power source lines can be wired among the main bit lines at a second wiring layer.

For example, in respect of a memory cell array of 512 words 1024 columns, in the case of a 1:64 constitution of the main/sub bit lines, when a first wiring layer is wired with 1024 of sub bit lines, a second wiring layer is wired with 16 of main bit lines and a wiring rate of the second wiring layer is ½ of that of the first wiring layer, 512−16=496 of wiring regions are provided and control signal lines or the like can be arranged in the wiring regions. Further, although according to the above-described respective embodiments, an explanation has been given with an arrangement of an NOR type memory cell matrix as an example, the present invention is not limited to such a constitution but is applicable also to a memory cell matrix of an NAND type or a virtual grounding type. Further, application of the present invention is not limited to only EEPROM but the present invention is applicable also to mask ROM or PROM. In the case of mask ROM or the like, there is constructed a constitution in which main bit lines connected with sub bit lines via a plurality of stages of Y switches are directly connected to reading circuits (sense amplifier) or the main bit lines are connected to the reading circuits further via the Y switches.

As has been explained, according to the present invention, arbitrary signal lines or power supply lines can be arranged above memory cell arrays, it is not necessary to arrange wiring regions at peripheral areas of the memory cell arrays and there is achieved an effect of capable of reducing a chip size.

The reason is that according to the present invention, intervals among main bit lines are widened and arbitrary signal lines or power source lines can be arranged among the main bit lines.

Further, according to the present invention, capacitances of main bit lines in view from reading/writing circuits can be reduced. The reason is that according to the present invention, there is constructed a constitution in which the main bit lines are connected with switches and connected with sub bit lines via pluralities of switches shunted from the switches.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A flash memory device comprising:
    a data line;
    a plurality of nodes;
    a plurality of first switches each inserted between an associated one of said nodes and said data line; and
    a plurality of memory portions each coupled to an associated one of said nodes;
    each of said memory portions including:
        a plurality of bit lines;
        a plurality of second switches inserted between a corresponding one of said bit lines and the associated one of said nodes;
        at least one common word line; and
        a plurality of flash memory cells each coupled to said common word line and a corresponding one of said bit lines, wherein said data line is formed by a first wiring layer of a first level and said bit lines are formed by a second wiring layer of a second level different from said first wiring layer.

2. The device as claimed in claim 1, said device further comprising:
    a power source line, an erasing source line, and an erasing source control signal line which are formed by said first wiring layer.

3. The device as claimed in claim 1, wherein said second switches are arranged on both sides of an area where said memory cells are formed.

4. A flash memory device comprising:
   a main bit line;
   a first switch connected to said main bit line;
   a second switch connected to said main bit line;
   a plurality of third switches coupled to said first switch;
   a plurality of fourth switches coupled to said second switch;
   a plurality of first sub bit lines each coupled to a corresponding one of said third switches;
   a plurality of second sub bit lines each coupled to a corresponding one of said fourth switches;
   at least one word line; and
   a plurality of flash memory cells each connected to said word line and a corresponding one of said first and second sub bit lines, wherein said main bit line is formed by a first wiring layer of a first level and said first and second sub bit lines are formed by a second wiring layer of a second level different from said first wiring layer.

5. The device as claimed in claim 4, said device further comprising:
   a power source line, an erasing source line, and an erasing source control signal line which are formed by said first wiring layer.

6. The device as claimed in claim 5, wherein said first switches are arranged on both sides of an area where said memory cells are formed.

7. A flash memory device comprising:
   a node;
   a plurality of main bit lines;
   a plurality of first switches connected between a corresponding one of said main bit lines and said node;
   a plurality of second switches each connected to a corresponding one of said main bit lines; and
   a plurality of blocks each connected to a corresponding one of said second switches;
   each of blocks including:
      a plurality of sub bit lines,
      a plurality of third switches connected to a corresponding one of said second switches and a corresponding one of said sub bit lines;
      at least one word line; and
      a plurality of flash memory cells each connected to a corresponding one of said sub bit lines and said word line.

8. The device as claimed in claim 7, wherein said second switches receive a control signal in common.

9. The device as claimed in claim 8, wherein said main bit lines are formed by a first wiring layer of a first level and said sub bit lines are formed by a second wiring layer of a second level different from said first wiring layer.

10. The device as claimed in claim 9, said device further comprising:
    a power source line, an erasing source line, and an erasing source control line which are formed by said first wiring layer.

11. The device as claimed in claim 10, wherein said third switches are arranged on both sides of an area where said memory cells are formed.

12. A flash memory device comprising:
    a plurality of memory cell array sectors;
        a plurality of main bit lines each crossing said memory cell array sectors;
        a plurality of first switching groups each arranged at a crossing point of a corresponding one of said sectors and a corresponding one of said main bit lines, each of said first switching groups having a plurality of first switches coupled to a corresponding one of said main bit lines;
        a plurality of second switching groups each coupled to a corresponding one of said first switches, said second switching groups having a plurality of second switches;
        a plurality of sub bit lines coupled to a corresponding one of said second switches.

13. The device as claimed in claim 12, said device further comprising:
    at least one word line; and
    a plurality of flash memory cells connected to a corresponding one of said sub bit lines and said word line.

14. The device as claimed in claim 13, wherein said sub bit lines are formed by a first wiring layer of a first level, and said main bit lines, a power source line, an erasing source line and an erasing source control line are formed by a second wiring layer of a second level different from said first wiring layer so that each of said erasing source line and said erasing source control signal line are arranged between a corresponding adjacent ones of said main bit lines.

15. A flash memory device comprising:
    a plurality of memory cell array sectors;
    a plurality of main bit lines each crossing said sectors;
    a plurality of reading/writing circuits;
    a first switching group connected between a corresponding one of said main bit lines and a corresponding one of said reading/writing circuits;
    a plurality of first switches each connected to a corresponding one of said main bit lines;
    a plurality of second switching groups each connected to a corresponding one of said first switches, said second switching groups each having a plurality of second switches;
    a plurality of sub bit lines each coupled to a corresponding one of said second switches of each of said second switching group.

16. The device as claimed in claim 15, said device further comprising:
    at least one word line; and
    a plurality of flash memory cells connected to a corresponding one of said sub bit lines and said word line.

17. The device as claimed in claim 16, wherein said sub bit lines are formed by a first wiring layer of a first level, and said main bit lines, a power source line, an erasing source line and an erasing source control line are formed by a second wiring layer of a second level different from said first wiring layer so that said power source line, each of said erasing source line and said erasing source control signal line are arranged between a corresponding adjacent ones of said main bit lines.

18. A semiconductor memory device comprising:
    at least one word line;
    a plurality of first memory cells coupled in common to said word line;
    a plurality of first conductive lines provided respectively for said first memory cells;
    a plurality of second memory cells coupled in common to said word line;

a plurality of second conductive lines provided respectively for said second memory cells;

third and fourth conductive lines;

a plurality of first switches each inserted between said third conductive line and an associated one of said first conductive lines;

a plurality of second switches each inserted between said fourth conductive line and an associated one of said second conductive lines;

a fifth conductive line;

a third switch inserted between said third and fourth conductive lines;

a fourth switch inserted between said fourth and fifth conductive lines.

19. The device as claimed in claim 18, further comprising:

a plurality of third memory cells coupled in common to said word line;

a plurality of sixth conductive lines provided respectively for said third memory cells;

a seventh line;

a plurality of fifth switches each inserted between said seventh conductive line and an associated one of said sixth conductive lines;

a sixth switch inserted between said seventh and fifth conductive lines.

20. The device as claimed in claim 19, wherein said first, second and third memory cells are arranged adjacently to one another to constitute a memory cell formation region, said first, second, third and fourth switches and said third and fourth conductive lines are arranged on one side of said memory cell formation region, and said seventh conductive line and said fifth and sixth switches are arranged on the other side of said memory cell formation region.

21. The device as claimed in claim 18, further comprising:

a sixth conductive line; and a fifth switch inserted between said fifth and sixth conductive lines.

22. The device as claimed in claim 21, wherein said first and second memory cells are arranged adjacently to each other to constitute a memory cell formation region, said first and third switches and said third conductive lines are arranged on one side of said memory cell formation region, and said second and fourth switches and said fourth conductive line are arranged on the other side of said memory cell formation region.

* * * * *